US011501670B2

(12) United States Patent
Kim et al.

(10) Patent No.: US 11,501,670 B2
(45) Date of Patent: Nov. 15, 2022

(54) FOLDABLE DISPLAY DEVICE

(71) Applicant: Samsung Display Co., Ltd., Yongin-Si (KR)

(72) Inventors: Sanggu Kim, Seoul (KR); Sungwoo Eo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/515,795

(22) Filed: Nov. 1, 2021

(65) Prior Publication Data

US 2022/0208030 A1 Jun. 30, 2022

(30) Foreign Application Priority Data

Dec. 31, 2020 (KR) ........................ 10-2020-0188930

(51) Int. Cl.
*G06F 3/041* (2006.01)
*G09F 9/30* (2006.01)
*G02B 1/14* (2015.01)
*G02B 1/11* (2015.01)
*G06F 1/16* (2006.01)

(52) U.S. Cl.
CPC ............... *G09F 9/301* (2013.01); *G02B 1/11* (2013.01); *G02B 1/14* (2015.01); *G06F 1/1652* (2013.01)

(58) Field of Classification Search
CPC ................... G09F 9/301; G06F 1/1652; G06F 2203/04102; G02B 1/11; G02B 1/14
See application file for complete search history.

(56) References Cited

U.S. PATENT DOCUMENTS

| 5,380,779 | A | 1/1995 | D'Haese | |
|---|---|---|---|---|
| 8,030,395 | B2 | 10/2011 | Tseng et al. | |
| 8,664,326 | B2 | 3/2014 | Lee et al. | |
| 9,353,298 | B2 | 5/2016 | Ha et al. | |
| 11,348,487 | B2* | 5/2022 | Lee | .......................... G09F 9/301 |
| 2013/0017389 | A1* | 1/2013 | Tamura | ...................... C09J 7/38 |
| | | | | 428/314.4 |
| 2014/0306187 | A1* | 10/2014 | Kim | ....................... H01L 27/323 |
| | | | | 524/45 |
| 2016/0291207 | A1* | 10/2016 | Yasuda | .................. G02B 5/008 |
| 2017/0200915 | A1* | 7/2017 | Lee | .......................... G06F 3/0412 |
| 2017/0305132 | A1* | 10/2017 | Dollase | ................. B32B 27/308 |
| 2017/0309867 | A1* | 10/2017 | Mun | ....................... C09J 133/08 |
| 2018/0088375 | A1* | 3/2018 | Kim | ....................... G02F 1/1339 |
| 2019/0086709 | A1* | 3/2019 | Lee | .......................... G06F 1/1643 |
| 2020/0095414 | A1* | 3/2020 | Shimizu | ................ C03C 17/324 |
| 2020/0332153 | A1* | 10/2020 | Park | ....................... H05K 5/0017 |
| 2020/0361192 | A1* | 11/2020 | Choi | ....................... C08G 18/73 |

(Continued)

FOREIGN PATENT DOCUMENTS

| KR | 10-0813388 | 3/2008 |
|---|---|---|
| KR | 10-2018-0040065 | 4/2018 |
| KR | 10-1933262 | 12/2018 |

*Primary Examiner* — Joe H Cheng
(74) *Attorney, Agent, or Firm* — F. Chau & Associates, LLC (57) ABSTRACT

A display device includes: a display module; a window disposed on the display module; a window protective layer disposed on the window; and a window adhesive layer disposed between the window and the window protective layer, wherein the window adhesive layer includes a surfactant, and has an adhesive force of about 100 gf/inch to about 300 gf/inch at about 25° C.

20 Claims, 7 Drawing Sheets

(56) References Cited

U.S. PATENT DOCUMENTS

| | | | |
|---|---|---|---|
| 2020/0395569 A1* | 12/2020 | Song | G06F 1/1616 |
| 2021/0079239 A1* | 3/2021 | Yoo | C09D 11/38 |
| 2021/0139747 A1* | 5/2021 | Du | C09J 7/10 |
| 2021/0184161 A1* | 6/2021 | Song | H01L 51/5237 |
| 2021/0187904 A1* | 6/2021 | Jeong | B32B 17/10 |
| 2021/0253918 A1* | 8/2021 | Kim | B32B 27/308 |

* cited by examiner

FOLDABLE DISPLAY DEVICE

CROSS-REFERENCE TO RELATED APPLICATIONS

This U.S. non-provisional patent application claims priority under 35 U.S.C. § 119 to Korean Patent Application No. 10-2020-0188930, filed on Dec. 31, 2020, the disclosure of which is incorporated by reference herein in its entirety.

TECHNICAL FIELD

The present inventive concept relates to a display device, and more particularly, to a foldable display device.

DISCUSSION OF THE RELATED ART

A display device provides a user with information by displaying various images on a display screen. Generally, a display device displays information within an assigned screen. Flexible display devices including a foldable flexible display panel are currently under development. A flexible display device may be folded, rolled, or bent, unlike a rigid display device. A flexible display device may variously change in shape to increase and decrease the screen size of the flexible display device, so that user convenience may be increased.

SUMMARY

According to an embodiment of the present inventive concept, a display device includes: a display module; a window disposed on the display module; a window protective layer disposed on the window; and a window adhesive layer disposed between the window and the window protective layer, wherein the window adhesive layer includes a surfactant, and has an adhesive force of about 100 gf/inch to about 300 gf/inch at about 25° C.

In an embodiment of the present inventive concept, the surfactant includes polyoxyethylene alkyl ether.

In an embodiment of the present inventive concept, the window adhesive layer further includes a polymer resin including at least one of an acryl-based resin, a silicone-based resin, a urethane-based resin, or an epoxy-based resin.

In an embodiment of the present inventive concept, the window adhesive layer includes: a surfactant layer including the surfactant and contacting the window; and a main adhesive layer, wherein the surfactant layer is disposed between the window and the main layer.

In an embodiment of the present inventive concept, a thickness of the window adhesive layer is about 10 μm to about 30 μm.

In an embodiment of the present inventive concept, a thickness of the window protective layer is about 40 μm to about 150 μm.

In an embodiment of the present inventive concept, the window adhesive layer has an adhesive force of about 10 gf/inch to about 60 gf/inch at a temperature greater than or equal to about 60° C.

In an embodiment of the present inventive concept, the surfactant is included in the window adhesive layer in an amount of about 0.1 wt % to about 3 wt % with respect to a total weight of the window adhesive layer.

In an embodiment of the present inventive concept, the display device further includes an antireflection layer disposed between the window and the display module.

In an embodiment of the present inventive concept, an upper surface of the window protective layer provides an uppermost surface of the display device.

In an embodiment of the present inventive concept, a first non-folding region, a folding region, and a second non-folding region are sequentially arranged along a first direction in the display module.

In an embodiment of the present inventive concept, the display device further includes: a protective layer disposed under the display module; and a plate disposed under the protective layer.

In an embodiment of the present inventive concept, the window adhesive layer contacts a lower surface of the window protective layer and an upper surface of the window.

In an embodiment of the present inventive concept, the display module includes: a base layer; a circuit layer disposed on the base layer; a light-emitting element layer disposed on the circuit layer; a sealing layer disposed on the light-emitting element layer; and a sensor layer disposed on the sealing layer.

According to an embodiment of the present inventive concept, a display device includes: a display module; a window disposed on the display module; a window protective layer disposed on the window; and a window adhesive layer disposed between the window and the window protective layer, wherein the window adhesive layer includes: a polymer resin including at least one of an acryl-based resin, a silicone-based resin, a urethane-based resin, or an epoxy-based resin, and a surfactant including polyoxyethylene alkyl ether.

In an embodiment of the present inventive concept, the window adhesive layer has an adhesive force of about 10 gf/inch to about 60 gf/inch at a temperature greater than or equal to about 60° C.

In an embodiment of the present inventive concept, an upper surface of the window protective layer is exposed to outside.

According to an embodiment of the present inventive concept, a display device includes: a display module configured to fold and unfold; a window disposed on the display module; a window protective layer disposed on the window; and a window adhesive layer disposed between the window and the window protective layer, and contacting an upper surface of the window and a lower surface of the window protective layer, wherein the window adhesive layer includes a surfactant.

In an embodiment of the present inventive concept, the surfactant includes polyoxyethylene alkyl ether.

In an embodiment of the present inventive concept, the window adhesive layer further includes a polymer resin including at least one of an acryl-based resin, a silicone-based resin, a urethane-based resin, or an epoxy-based resin.

BRIEF DESCRIPTION OF THE DRAWINGS

The above and other features of the present inventive concept will become more apparent by describing in detail embodiments thereof with reference to the attached drawings, in which.

DETAILED DESCRIPTION OF EMBODIMENTS

In this specification, when a component (or region, layer, portion, etc.) is referred to as "on", "connected", or "coupled" to another component, it can be directly disposed on, connected to, or coupled to the other component or an intervening third component can be arranged between them.

The same reference numerals may refer to the same elements throughout the specification. In addition, in the drawings, thicknesses, ratios, and dimensions of components may be exaggerated for clarity. In other words, since the thicknesses, ratios, and dimensions of components in the drawings may be exaggerated for clarity, the following embodiments of the present inventive concept are not limited thereto. It will be understood that the term "and/or" includes all combinations of one or more of the associated listed items.

Terms such as 'first' and 'second' may be used to describe various components, but the components should not be limited by the terms. These terms are only used for the purpose of distinguishing one component from other components. For example, without departing from the scope of the present inventive concept, a first component may be referred to as a second component, and similarly, a second component may be referred to as a first component. It will be understood that singular expressions include plural expressions unless the context clearly indicates otherwise.

In addition, terms such as "below", "lower", "above", and "upper" may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In addition, the terms are relative concepts and are described based on the directions indicated in the drawings.

Hereinafter, embodiments of the present inventive concept will be described with reference to the accompanying drawings.

Figure 1A:
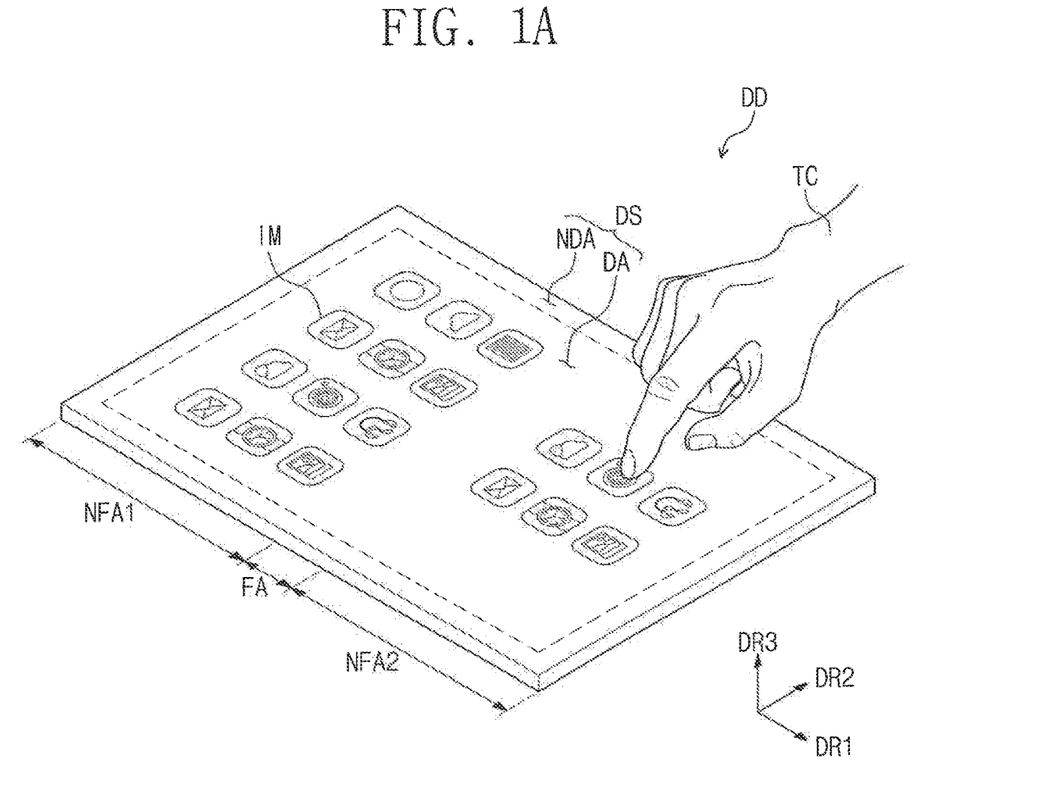
FIG. 1A is a perspective view of a display device according to an embodiment of the present inventive concept.
Figure 1B:
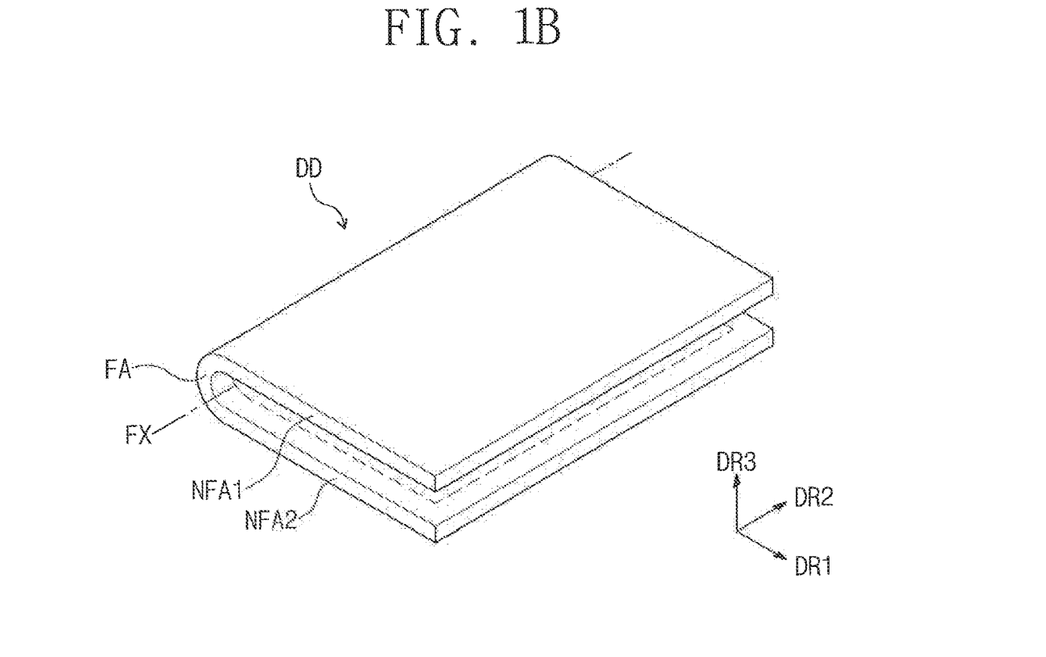
FIG. 1B is a diagram illustrating a state in which the display device illustrated in FIG. 1A is folded.

FIG. 1A is a perspective view of a display device according to an embodiment of the present inventive concept. FIG. 1B is a diagram illustrating a state in which the display device illustrated in FIG. 1A is folded.

Referring to FIGS. 1A and 1B, a display device DD may be a foldable display device. The display device DD according to the present inventive concept may be used in small- and medium-sized electronic devices such as mobile phones, tablets, car navigation systems, portable gaming units, and smart watches, as well as large-sized electronic devices such as televisions, and monitors.

The upper surface of the display device DD may be a display surface DS, and the display surface DS of the display device DD in an unfolded state may have a plane provided by a first direction DR1 and a second direction DR2. A third direction DR3 is a direction crossing the first direction DR1 and the second direction DR2, and may be a thickness direction of the display device DD. The front (or, e.g., the upper) surfaces and the rear (or, e.g., the lower) surfaces of members forming the display device DD may be based on the third direction DR3.

The display surface DS may include a display region DA, and a non-display region NDA around the display region DA. The display region DA is a region in which an image IM is displayed, and the non-display region NDA is a region in which the image IM is not displayed. In FIG. 1A, application icons are illustrated as an example of the image IM. However, the present inventive concept is not limited thereto.

The display region DA may be a polygonal shape, such as a rectangular shape. The non-display region NDA may at least partially surround the display region DA. However, an embodiment of the present inventive concept is not limited thereto, and the shape of the display region DA and the shape of the non-display region may be designed relatively.

A first non-folding region NFA1, a folding region FA, and a second non-folding region NFA2 may be sequentially provided along the first direction DR1 in the display device DD. In other words, the folding region FA may be provided between the first non-folding region NFA1 and the second non-folding region NFA2. In FIGS. 1A and 1B, one folding region FA, first and second non-folding regions NFA1 and NFA2 are illustrated, but the numbers of the folding region FA, and the first and second non-folding regions NFA1 and NFA2 are not limited thereto. For example, the display device DD may include at least three non-folding regions, and a plurality of folding regions disposed between the non-folding regions.

The display device DD may be folded with respect to a folding axis FX. For example, the folding region FA may be bent with respect to the folding axis FX. The folding axis FX may extend along the second direction DR2. The folding axis FX may be an axis parallel to a short side of the display device DD.

When the display device DD is folded, the display surface of the first non-folding region NFA1 and the display surface of the second non-folding region NFA2 may face each other. Accordingly, the display surface DS may not be exposed to outside in a folded state. In an embodiment of the present inventive concept, a rear display region may be provided on the rear surface of the display device DD. In this case, when the display device DD is folded, the rear display region may be exposed to the outside, and may be referred to as in-folding. However, this is illustrated as an example, and the operation of the display device DD is not limited thereto.

For example, in an embodiment of the present inventive concept, when the display device DD is folded, the first non-folding region NFA1 and the second non-folding region NFA2 may be opposed to each other. Accordingly, the display region DA may be exposed to the outside in a folded state, and this state may be referred to as out-folding.

The display device DD may be able to perform an in-folding operation or out-folding operation. In addition, the display device DD may perform both the in-folding operation and the out-folding operation. In this case, the same region of the display device DD, for example, the folding region FA may be in-folded and out-folded. In addition, a portion of the display device DD may be in-folded, and another portion of display device DD may be out-folded.

Figure 2A:
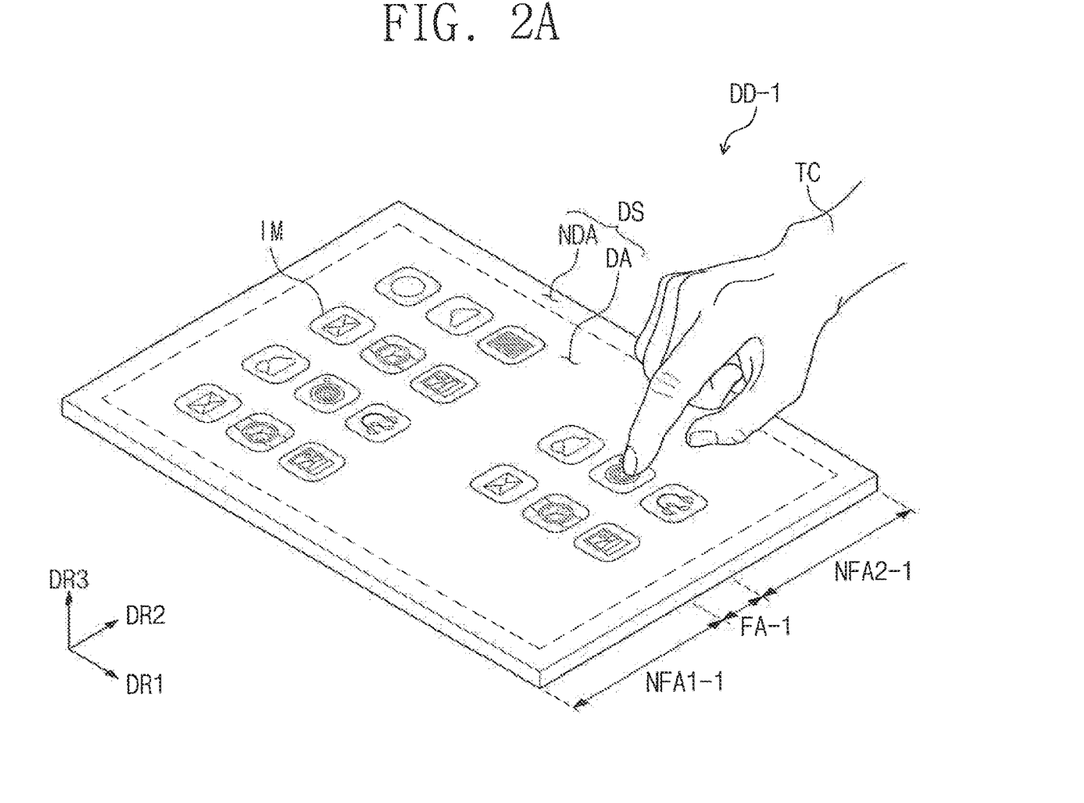
FIG. 2A is a perspective view of a display device according to an embodiment of the present inventive concept.
Figure 2B:
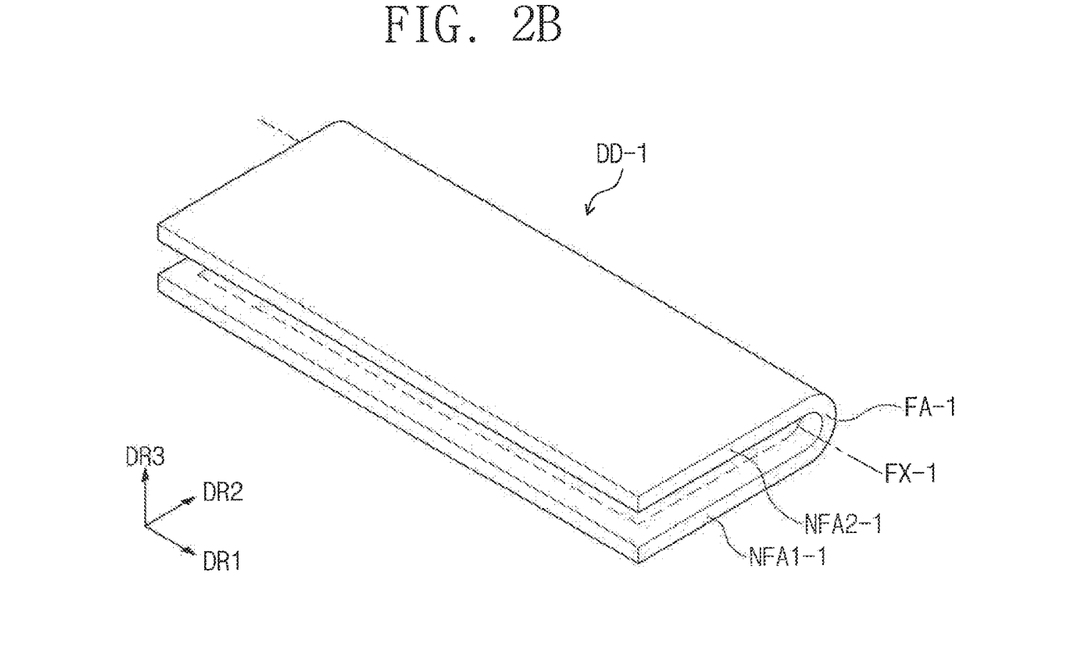
FIG. 2B is a diagram illustrating a state in which the display device illustrated in FIG. 2A is folded.

FIG. 2A is a perspective view of a display device according to an embodiment of the present inventive concept. FIG. 2B is a diagram illustrating a state in which the display device illustrated in FIG. 2A is folded.

Referring to FIGS. 2A and 2B, a first non-folding region NFA1-1, a folding region FA-1, and a second non-folding region NFA2-1 may be sequentially provided along the second direction DR2 in a display device DD-1. The folding region FA-1 may be provided between the first non-folding region NFA1-1 and the second non-folding region NFA2-1.

The display device DD-1 may be folded with respect to the folding axis FX-1. For example, the folding region FA-1 may extend along the first direction DR1. The folding axis FX-1 may be an axis parallel to a long side of the display device DD-1.

Hereinafter, as illustrated in FIGS. 1A and 1B, the structure of a display device DD folded with respect to the folding axis FX parallel to a short side thereof will be described, but an embodiment of the present inventive concept is not limited thereto. Thus, structures to be described later may be applied to the display device DD-1 folded with respect to the folding axis FX-1 parallel to the long side thereof, as illustrated in FIGS. 2A and 2B.

Figure 3A:
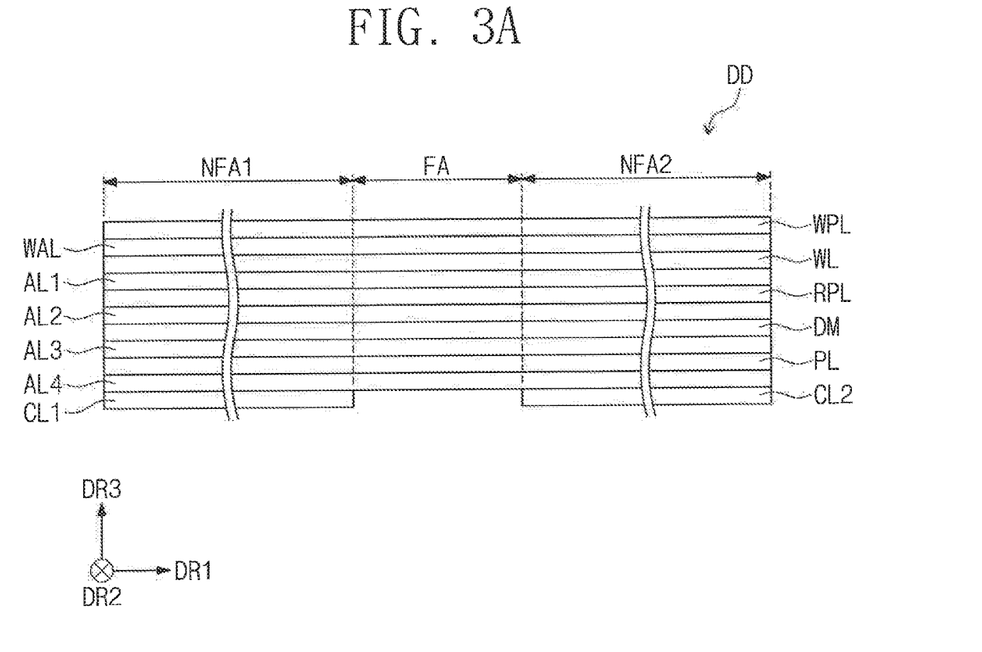
FIG. 3A is a cross-sectional view of a display device according to an embodiment of the present inventive concept.
Figure 3B:
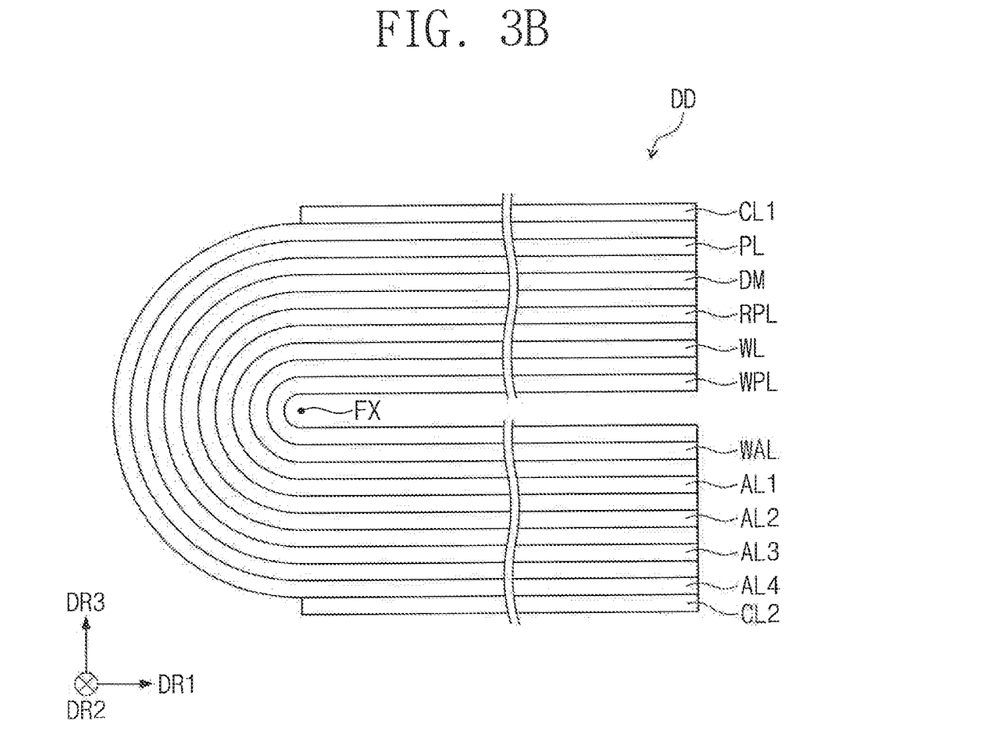
FIG. 3B is a cross-sectional view illustrating a state in which the display device illustrated in FIG. 3A is folded.

FIG. 3A is a cross-sectional view of a display device according to an embodiment of the present inventive concept. FIG. 3B is a cross-sectional view illustrating a state in which the display device illustrated in FIG. 3A is folded.

Referring to FIGS. 3A and 3B, the display device DD may include a window protective layer WPL, a window WL, an antireflection layer RPL, a display module DM, a protective layer PL, first and second cover plates CL1 and CL2, and adhesive layers WAL, AL1, AL2, AL3, and AL4.

The display device DD may be changed from a flat first state to a folded second state, and/or may be repeatedly changed in shape from the second state to the first state. The window protective layer WPL, the window WL, the antireflection layer RPL, the display module DM, the protective layer PL, and the adhesive layers WAL, AL1, AL2, AL3, and AL4 may have flexibility. The window protective layer WPL, the window WL, the antireflection layer RPL, the display module DM, the protective layer PL, and the adhesive layers WAL, AL1, AL2, AL3, and AL4 may each include the folding region FA. In an embodiment of the present inventive concept, the display module DM may include the folding region FA. The display module DM may include the first non-folding region NFA1, the folding region FA, and the second non-folding region NFA2 extended along the first direction DR1.

The window protective layer WPL may be optically transparent. The window protective layer WPL may provide the outermost surface of the display device DD. The upper surface of the window protective layer WPL may be the uppermost surface of the display device DD. In other words, other components may not be disposed on the window protective layer WPL in the display device DD according to an embodiment of the present inventive concept. However, the present inventive concept is not limited thereto.

The window protective layer WPL may protect components disposed under the window protective layer WPL. For example, the window protective layer WPL may include a protective film. In addition to the protective film, the window protective layer WPL may further include, on the upper surface and/or the lower surface of the protective layer, a hard coating layer, an anti-fingerprint layer, etc., to improve properties such as chemical resistance and abrasion resistance.

The window WL may be disposed under the window protective layer WPL. The window WL may have an optically transparent property. The window protective layer WPL and the window WL may be bonded to each other via the window adhesive layer WAL. The window WL may include an optically transparent insulating material. The window WL may have a multilayer structure or a single layer structure.

A hard coating layer may be disposed on the upper surface of the window WL. The hard coating layer may be a functional layer to improve use characteristics of the display device DD, and may be coated and provided on, for example, the upper surface of the window WL. For example, anti-pollution property, anti-scratch property, impact resistance, etc., may be provided by the hard coating layer. The thickness of the hard coating layer may be about 1 μm to about 5 μm, and, for example, may be about 1.5 μm.

An impact-absorbing layer may be disposed under the lower surface of the window WL. The impact-absorbing layer may be a functional layer to protect the display module DM from an external impact. The impact-absorbing layer may be selected from films having an elastic modulus of at least about 1 GPa at room temperature. The impact-absorbing layer may be a stretchable film including an optical function. For example, the impact-absorbing layer may be an optical axis control film of which the optical axis is controlled. The thickness of the impact-absorbing layer may be about 35 μm to about 45 μm, for example, about 41 μm, but the thickness of the impact-absorbing layer is not limited thereto. In an embodiment of the present inventive concept, the impact-absorbing layer may be omitted.

A black matrix may be disposed on the surface of the window WL. The black matrix may be printed and provided on one surface of the impact-absorbing layer. The black matrix may overlap a non-display region NDA. The black matrix may be a colored layer, and may be formed through coating. The black matrix may include a colored organic material or an opaque metal, and a material forming the black matrix is not limited thereto.

Hereinafter, the window WL, the window protective layer WPL, and the window adhesive layer WAL will be described in more detail with reference to FIG. 4.

The antireflection layer RPL may be disposed under the window WL. The antireflection layer RPL and the window WL may be bonded to each other via the first adhesive layer AL1. The antireflection layer RPL may reduce the reflectance of external light incident from the outside of the display device DD. In an embodiment of the present inventive concept, the antireflection layer RPL may be omitted, or may be built in the display module DM.

The antireflection layer RPL according to an embodiment of the present inventive concept may include a retarder and/or a polarizer. The retarder may be a film type or a liquid crystal coating type, and may include a λ/2retarder and/or a λ/4retarder. The polarizer may be also a film type, and may include a stretchable polymer resin film. The retarder and the polarizer may further include a protective film. The retarder and the polarizer, or the protective film may be a base layer of the antireflection layer RPL.

The antireflection layer RPL according to an embodiment of the present inventive concept may include color filters. The color filters may have a predetermined array. The array of the color filters may be determined in consideration of emission colors of pixels included in the display module DM. For example, the antireflection layer RPL may further include the black matrix adjacent to the color filters.

The antireflection layer RPL according to an embodiment of the present inventive concept may include a destructive interference structure. For example, the destructive interference structure may include a first reflective layer and a second reflective layer which are respectively disposed on different layers. First reflected light and second reflected light, respectively reflected from the first reflective layer and the second reflective layer, may interfere with each other destructively, and, accordingly, the reflectance of external light may be decreased.

The display module DM may be disposed under the antireflection layer RPL. The display module DM and the antireflection layer RPL may be bonded to each other via the second adhesive layer AL2. In an embodiment of the present inventive concept, the second adhesive layer AL2 may be omitted, and the antireflection layer RPL may be disposed directly on the display module DM. For example, the antireflection layer RPL may be disposed directly on an input sensing layer ISL (e.g., a sensor layer) (see FIG. 5) included in the display module DM, and may be included in the display module DM. In addition, the phrase "the component of B is disposed directly on the component of A" means that a separate adhesive layer and/or adhesive member are not disposed between the component of A and the component of B. When the component of B is disposed directly on the component of A, the component of B may be formed through a continuous process on the base surface provided with the component of A, after formation of the component of A. For example, the antireflection layer RPL may be a layer formed on the input sensing layer ISL of the display module DM through a continuous process.

The protective layer PL may be disposed on the display module DM. For example, the protective layer PL may be disposed under the display module DM. The protective layer PL and the display module DM may be bonded to each other via the third adhesive layer AL3. The protective layer PL may be a layer protecting the rear surface of the display module DM.

The protective layer PL may include a polymer film. For example, the protective layer PL may include a polyimide film, a polyamide film, a polyether ether ketone film, and/or a polyethylene terephthalate film. The thickness of the polymer film included in the protective layer PL may be, for example, about 20 µm to about 50 µm. The polymer film included in the protective layer PL may be a layer having a high modulus to protect the display module DM from an external impact.

The protective layer PL may include a cushion layer. In this case, the protective layer PL may include, for example, a sponge, a foam, or a urethane resin, etc. For example, the protective layer PL may include a polyurethane foam, or a thermoplastic polyurethane foam. In addition, the protective layer PL may include an acrylonitrile butadiene styrene (ABS) copolymer foam, a polyethylene (PE) foam, an ethylene vinyl acetate (EVA) foam, or a polyvinyl chloride (PVC) foam, etc. The protective layer PL may have a structure in which a cushion layer is formed with the above-described polymer film as a base layer. The cushion layer may have a lower modulus than that of the above-described polymer film, and may be a layer that absorbs an external impact due to the low density thereof. The thickness of the cushion layer may be about 80 µm to about 120 µm.

The protective layer PL may have a color that absorbs light. For example, the protective layer PL may have a black color. At least one of the polymer film or the cushion layer included in the protective layer PL may include a black material. Accordingly, components disposed under the protective layer PL may be prevented from being visually recognized from the outside.

The fourth adhesive layer AL4 may be attached to a lower portion of the protective layer PL. The window adhesive layer WAL, and the first to fourth adhesive layers AL1, AL2, AL3, and AL4, which have been described previously, may include a typical bonding agent or adhesive.

A first cover plate CL1 and a second cover plate CL2 may be disposed under the fourth adhesive layer AL4. The first cover plate CL1 may be disposed in the first non-folding region NFA1, and the second cover plate CL2 may be disposed in the second non-folding region NFA2. The first cover plate CL1 and the second cover plate CL2 may be spaced apart from each other. As the first cover plate CL1 and the second cover plate CL2 are spaced from each other, a predetermined gap may be provided between the first cover plate CL1 and the second cover plate CL2 and may overlap the folding region FA. For example, the first and second cover plates CL1 and CL2 may not overlap the folding region FA; however, the present inventive concept is not limited thereto. The shape of the display device DD may be easily changed by the predetermined gap provided between the first cover plate CL1 and the second cover plate CL2.

The first cover plate CL1 and the second cover plate CL2 may be, for example, a metal plate, or a plastic plate. For example, the first cover plate CL1 and the second cover plate CL2 may include stainless steel, aluminum, or an alloy thereof. For example, each of the first cover plate CL1 and the second cover plate CL2 may include SUS304. The strengths of the first cover plate CL1 and the second cover plate CL2 may be greater than the strength of the display module DM.

In an embodiment of the present inventive concept, each of the first cover plate CL1 and the second cover plate CL2 may be extended toward the folding region FA. In this case, the first cover plate CL1 and the second cover plate CL2 may not be attached to the fourth adhesive layer AL4 in the folding region FA.

Each of the first cover plate CL1 and the second cover plate CL2 may include a material of which the elastic modulus is at least about 60 GPa at room temperature. Each of the first cover plate CL1 and the second cover plate CL2 may support components disposed there above. In addition, the heat dissipation performance of the display device DD may be increased by each of the first cover plate CL1 and the second cover plate CL2.

The display device DD may further include a cover layer attached to lower portions of the first cover plate CL1 and the second cover plate CL2. The cover layer may be attached to the lower portions of the first cover plate CL1 and the second cover plate CL2 via a lower adhesive layer including a typical bonding agent or adhesive. The lower adhesive layer may not overlap the folding region FA. As the cover layer covers a predetermined gap provided between the first cover plate CL1 and the second cover plate CL2, foreign matters may be prevented from entering through the predetermined gap.

The display may further include a lower plate, a heat dissipation sheet, an insulating film, etc., which are disposed under the first cover plate CL1 and the second cover plate CL2. The display device DD may further include a step-compensating member. The display device DD may further include a lower cushion layer disposed under the insulating film, the step-compensating member, etc.

The lower plate may have a predetermined rigidity, and may prevent the shapes of the components disposed above the lower plate from being changed. The lower plate may include a metal alloy.

The heat dissipation sheet may be attached to a lower portion of the lower plate, and may be a thermally conductive sheet having a high thermal conductivity. As the display device DD according to an embodiment of the present inventive concept includes the heat dissipation sheet, the heat generated by driving and operating the display device DD may be dissipated to the outside.

The insulating film may be attached to a lower portion of the heat dissipation sheet. For example, the insulating film may prevent movement from occurring in the display device DD and may insulate the display device DD.

The step-compensating member may be attached to lower portions of the first cover plate CL1 and the second cover plate CL2. For example, the cover layer described already may be attached, via a lower bonding layer, to a lower portion of a part of the first cover plate CL1 and a lower portion of a part of the second cover plate CL2, and the step-compensating member may be attached to a lower portion of the remaining part on which the lower bonding layer is not attached. For example, the step-compensating member may be attached to the remaining parts of the lower portions of the first cover plate CL1 and the second cover plate CL2, on which the lower bonding layer and the cover layer are not provided. For example, the step-compensating member may be a polymer resin film.

Figure 4A:
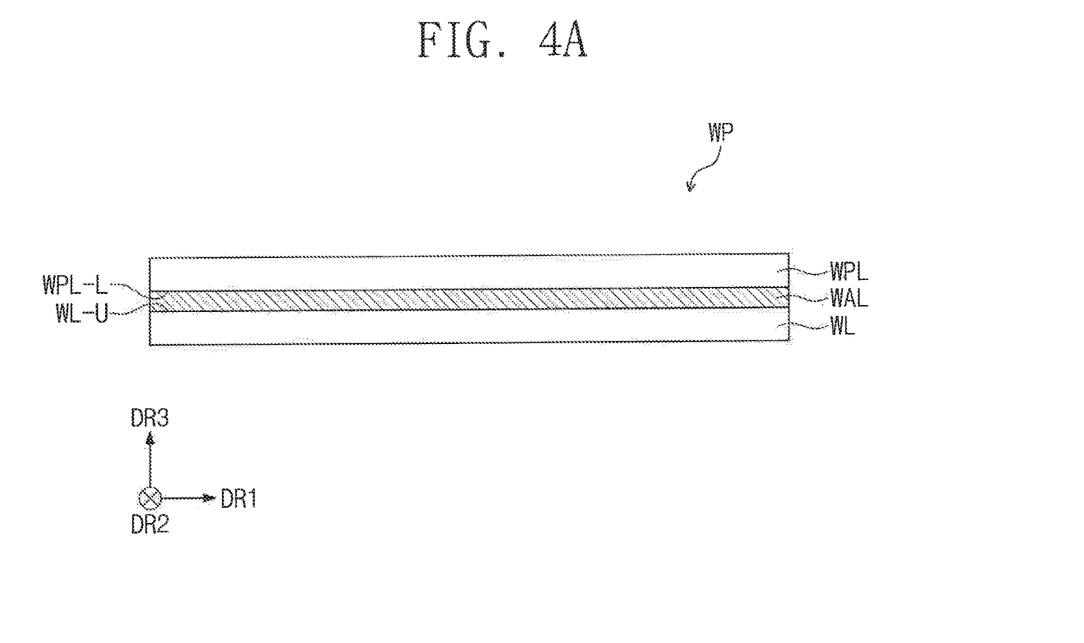
FIGS. 4A and 4B are cross-sectional views of a window structure according to an embodiment of the present inventive concept.
Figure 4B:
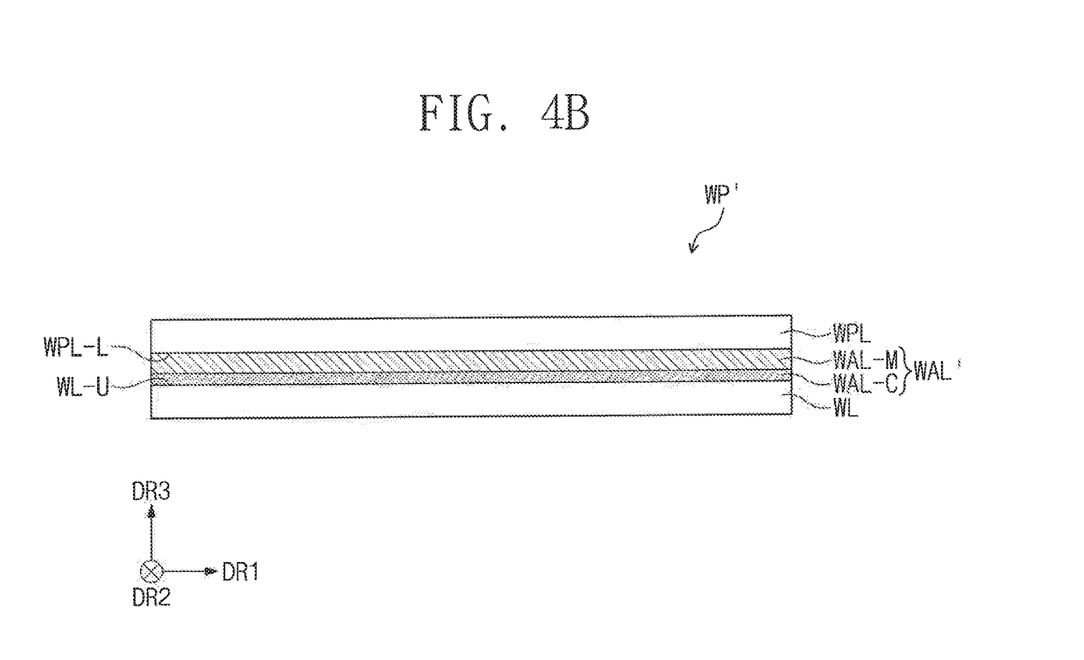

FIGS. 4A and 4B are cross-sectional views of a window structure according to an embodiment of the present inventive concept.

Referring to FIG. 4A, the window structure WP of an embodiment of the present inventive concept includes a window WL, a window protective layer WPL disposed on the window WL, and a window adhesive layer WAL disposed between the window WL and the window protective layer WPL. The window adhesive layer WAL may be disposed between the window protective layer WPL and the window WL, and may contact the lower surface WPL-L of the window protective layer WPL and the upper surface WL-U of the window WL.

The window protective layer WPL may be optically transparent. The window protective layer WPL may provide the outermost surface of the display device DD. An upper surface of the window protective layer WPL may be the uppermost surface of the display device DD. For example, in the display device DD of an embodiment of the present inventive concept, another component may not be disposed above the window protective layer WPL.

The window protective layer WPL may protect components disposed under the window protective layer WPL. The window protective layer WPL may include a protective film of which the elastic modulus is about 15 GPa or less at room temperature. For example, the window protective layer WPL may include polyethylene terephthalate (PET). For example, the thickness of the window protective layer WPL may be about 40 μm to about 150 μm, but the thickness of the window protective layer WPL is not limited thereto. In an embodiment of the present inventive concept, the window protective layer WPL may have a multilayer structure or a single layer. For example, the window protective layer WPL may include a plurality of polymer resin films bonded together through a typical bonding agent or adhesive. For example, the window protective layer WPL may include a first protective layer, a second protective layer, and a protective adhesive layer that bonds the first and second protective layers together. For example, in the window protective layer WPL, the thicknesses of the first protective layer and the second protective layer may be about 30 μm to about 120 μm, respectively.

In addition to the protective film in the window protective layer WPL, a hard coating layer, an anti-fmgerprint layer, etc., may be provided on an upper surface and/or a lower surface of the protective film to improve characteristics of the window protective layer WPL, such as chemical resistance, abrasion resistance. The hard coating layer may be formed from a hard coating composition including at least one of an organic composition, an inorganic composition, and/or an organic-inorganic composite composition. For example, the hard coating layer may be formed from a hard coating composition including at least one of an acrylate-based compound, a siloxane compound, and/or a silsesquioxane compound. In addition, the hard coating layer may further include inorganic particles. The inorganic particles may further increase the hardness of the hard coating layer. The inorganic particles may include at least one of $SiO_2$, $TiO_2$, $Al_2O_3$, $ZrO_2$, ZnO, AlN, and/or $Si_3N_4$. In addition, the inorganic particles may be surface-treated with an organic material such as silane to increase the degree of dispersion in the hard coating composition.

The window WL may be disposed under the window protective layer WPL. The window WL may be optically transparent. The window WL and the window protective layer WPL may be bonded to each other by the window adhesive layer WAL. The window WL may include an optically transparent insulating material. For example, the window WL may include a glass substrate, or a polymer resin film. The thickness of the window WL may be about 80 μm or less, for example, about 40 μm, but the thickness of the window WL is not limited thereto. For example, the window WL may include a thin glass substrate having a thickness of about 40 μm.

When the window WL is a polymer resin film, the window WL may include, for example, a polyimide (PI) film, or a polyethylene terephthalate (PET) film. However, an embodiment of the present inventive concept is not limited thereto, and the window WL may include a film including at least one of polyamide, polyimide, polyacrylate, polymethylmethacrylate (PMMA), polycarbonate (PC), polyethylenenaphthalate (PEN), polyvinylidene chloride, polyvinylidene difluoride (PVDF), polystyrene, and/or ethylene vinylalcohol copolymer.

The window WL may have a multilayer structure or a single layer structure. For example, the window WL may include a plurality of polymer resin films bonded to each other with a bonding agent, or may include a glass substrate and a polymer reins film bonded to each other with a bonding agent.

The window adhesive layer WAL may have a thickness of about 10 μm to about 30 μm. When the thickness of the window adhesive layer WAL is less than about 10 μm, sufficient adhesive force with which the window WL and the window protective layer WPL adhere to each other may not be secured, and the window WL and the window protective layer WPL may contact each other during a folding operation, thereby causing damage due to friction. When the thickness of the window adhesive layer WAL is more than about 30 μm, the folding characteristics of the display device DD may deteriorate.

The window adhesive layer WAL includes a surfactant. The window adhesive layer WAL may include a surfactant and a polymer resin cross-linked through a curing process.

The surfactant included in the window adhesive layer WAL may be a non-ionic surfactant. The surfactant has a non-charged hydrophilic group, and may thus be a non-ionic surfactant which is not ionized in an aqueous solution. For example, the surfactant may include a polyoxyethylene surfactant such as polyoxyethylene alkyl ether, polyoxyethylene alkylphenyl ether, and/or polyoxyethylene polyoxypropylene alkyl ether. In an embodiment of the present inventive concept, the surfactant may include polyoxyethylene alkyl ether.

The surfactant included in the window adhesive layer WAL may be included in an amount of about 0.1 wt % (weight percent) to about 3 wt % with respect to the total weight of the window adhesive layer WAL. For example, an adhesive composition, which forms the window adhesive layer WAL, may include about 0.1 wt % to about 3 wt % of a surfactant. The adhesive composition, which forms the window adhesive layer WAL, may include about 1 wt % of a surfactant. When the window adhesive layer WAL includes a surfactant in an amount of less than about 1 wt %, the adhesive force between the window WL and the window adhesive layer WAL may increase, so that the residue of the window adhesive layer WAL may be present on the surface of the window WL during removal for rework of the window protective layer WPL. When the window adhesive layer WAL includes a surfactant in an amount of more than about 3 wt %, the adhesive force between the window WL and the window adhesive layer WAL may decrease, so that a buckling defect may occur in the window adhesive layer WAL during a folding operation of the display device DD.

The window adhesive layer WAL may further include a polymer resin. For example, the window adhesive layer WAL may be an adhesive layer including at least one of an acryl-based resin, a silicone-based resin, a urethane-based resin, and/or an epoxy-based resin.

The window adhesive layer WAL may include, for example, an ultraviolet curable adhesive. The window adhesive layer WAL may be an adhesive layer formed by being polymerized and cured through at least one reaction of a radical polymerization reaction or a cationic polymerization reaction.

In addition, the window adhesive layer WAL may be formed of an adhesive composition including a radical polymerizable compound including a radical polymerization reactive group. For example, the radical polymerizable compound may be an acryl-based compound, for example, a methacrylate compound.

The adhesive composition, which forms the window adhesive layer WAL, may include a photoinitiator, etc. In addition, the adhesive composition may further include known additives such as a photosensitizer, a silane coupling agent, a plasticizer, and an antifoaming agent, in addition to the photoinitiator.

The window adhesive layer WAL may have an adhesive force of about 100 gf/inch to about 300 gf/inch at room temperature (e.g., about 25° C.). In an embodiment of the present inventive concept, the adhesive force on the interface between the window WL and the window adhesive layer WAL may be about 100 gf/inch to about 300 gf/inch under the condition of room temperature (e.g., about 25° C.). The adhesive force measured immediately after the window WL and the window adhesive layer WAL are attached to the interface between the window WL and the window adhesive layer WAL may be about 100 gf/inch to about 200 gf/inch under the condition of room temperature (e.g., about 25° C.). The adhesive force measured one day (24 hours) after the window WL and the window adhesive layer WAL are attached to the interface between the window WL and the window adhesive layer WAL may be about 200 gf/inch to about 300 gf/inch under the condition of room temperature (e.g., about 25° C.).

The window adhesive layer WAL may have an adhesive force of about 10 gf/inch to about 60 gf/inch at a high temperature of about 60° C. or more. The window adhesive layer WAL may have an adhesive force of about 10 gf/inch to about 60 gf/inch under the condition of applying a high temperature of about 60° C. or more for about ten minutes. In an embodiment of the present inventive concept, the adhesive force on the interface between the window WL and the window adhesive layer WAL may be about 10 gf/inch to about 60 gf/inch at a high temperature of about 60° C. or more. The adhesive force measured one day (24 hours) after the window WL and the window adhesive layer WAL are attached to the interface between the window WL and the window adhesive layer WAL may be about 10 gf/inch to about 60 gf/inch under the condition of about 60° C. The adhesive force measured one day (24 hours) after the window WL and the window adhesive layer WAL are attached to the interface between the window WL and the window adhesive layer WAL may be about 10 gf/inch to about 50 gf/inch under the condition of about 80° C.

The display device DD, according to an embodiment of the present inventive concept, includes a window WL disposed in an upper portion of the display device DD, and a window protective layer WPL disposed on the window WL. The window WL and the window protective layer WPL may be attached to each other via a window adhesive layer WAL. The window adhesive layer WAL includes a surfactant such as polyoxyethylene alkyl ether, and has an adhesive force of about 100 gf/inch to about 300 gf/inch at room temperature (e.g., about 25° C.). Accordingly, the display device DD, according to an embodiment of the present inventive concept, makes it possible to perform rework processing on the window protective layer WPL while preventing a buckling defect of an adhesive layer caused by folding.

In the case where the window adhesive layer WAL provided between the window WL and the window protective layer WPL does not include a surfactant, the residue of the window adhesive layer WAL occurs on the surface of the window WL due to the high adhesive force of the window adhesive layer WAL during removal of the window protective layer WPL and the window adhesive layer WAL, from the window WL, for rework processing, so that rework processing may become impossible. However, since the display device DD according to an embodiment of the present inventive concept includes a surfactant in the window adhesive layer WAL, the display device DD may have an adhesive force of about 100 gf/inch to about 300 gf/inch at room temperature (about 25° C.). Therefore, the reside of the window adhesive layer WAL does not occur during removal of the window protective layer WPL and the window adhesive layer WAL, from the window WL, for rework processing, and therefore rework processing of the window protective layer WPL may be performed while preventing a buckling defect of an adhesive layer caused by folding.

Referring to FIG. 4B, in a window structure WP' according to an embodiment of the present inventive concept, a window adhesive layer WAL' may include a surfactant layer WAL-C, and a main adhesive layer WAL-M.

The surfactant layer WAL-C is a layer including the above-described surfactant, and may be a layer formed by being coated with a surfactant. In an embodiment of the present inventive concept, the surfactant layer WAL-C may include a polyoxyethylene-based surfactant such as polyoxyethylene alkyl ether, polyoxyethylene alkylphenyl ether, and polyoxyethylene polyoxypropylene alkyl ether. In an embodiment of a present inventive concept, the surfactant layer WAL-C may include polyoxyethylene alkyl ether.

The surfactant layer WAL-C may be a layer contacting the window WL. The surfactant layer WAL-C may contact the upper surface WL-U of the window WL, and may be a layer formed by coating the upper surface WL-U of the window WL with a surfactant. In addition, the surfactant layer WAL-C may be a layer formed by coating, with a surfactant, the lower surface of the main adhesive layer WAL-M to be described later.

The main adhesive layer WAL-M may include, for example, a polymer resin and an ultraviolet curable adhesive to perform an adhesive function. The main adhesive layer WAL-M may be an adhesive layer including at least one of an acryl-based resin, a silicone-based resin, a urethane-based resin, and/or an epoxy-based resin. For example, the main adhesive layer WAL-M may be an adhesive layer formed by being polymerized and cured through at least one reaction of a radical polymerization reaction or a cationic polymerization reaction.

The main adhesive layer WAL-M may be spaced apart from the window WL with the surfactant layer WAL-C therebetween. The main adhesive layer WAL-M may be disposed between the surfactant layer WAL-C and the window protective layer WPL, and may contact an upper surface of the surfactant layer WAL-C and a lower surface of the window protective layer WPL-L.

The window adhesive layer WAL' included in the window structure WP' of an embodiment of the present inventive concept may form the surfactant layer WAL-C between the window WL and the main adhesive layer WAL-M which performs an adhesive function, thereby controlling the adhesive force for the upper surface WL-U of the window WE For example, as described above, the window adhesive layer WAL' may have an adhesive force of about 100 gf/inch to about 300 einch at room temperature (e.g., about 25° C.) on the upper surface WL-U of the window WL. Accordingly, a display device according to an embodiment of the present inventive concept may make it possible to perform rework processing of the window protective layer while preventing a buckling defect of an adhesive layer caused by folding.

Figure 5:
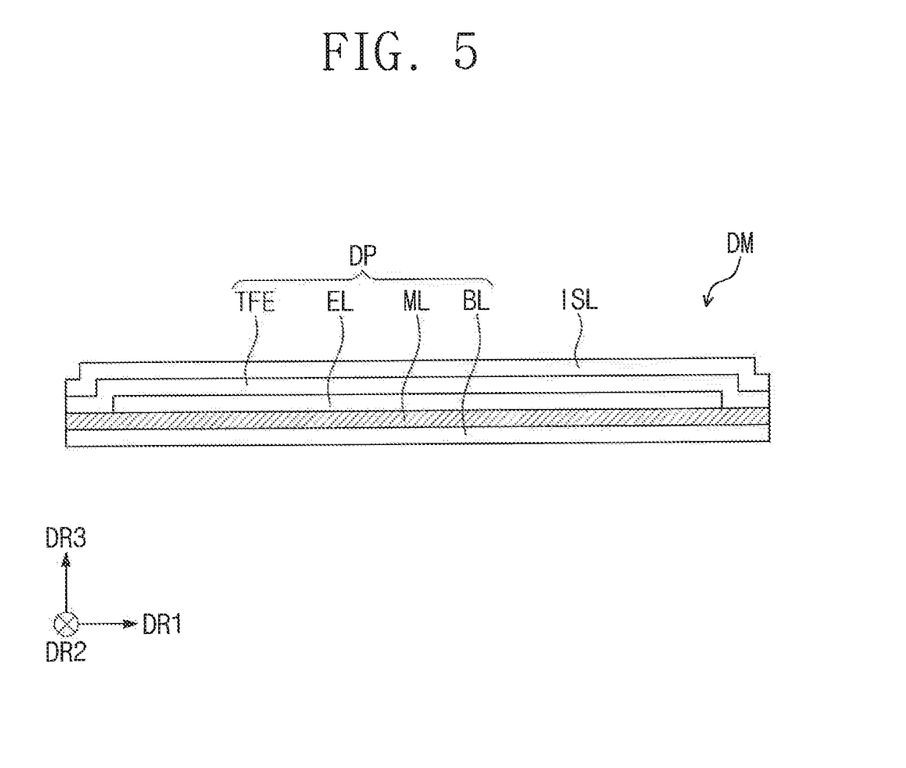
FIG. 5 is a schematic cross-sectional view of a display module according to an embodiment of the present inventive concept.

FIG. 5 is a schematic cross-sectional view of a display module according to an embodiment of the present inventive concept.

Referring to FIG. 5, the display module DM may include a display panel DP and an input sensing layer ISL.

The display panel DP according to an embodiment of the present inventive concept may be a light-emitting display panel, but the present inventive concept is not limited thereto. For example, the display panel DP may be an organic light-emitting display panel, or a quantum dot light-emitting display panel. A light-emitting layer of the organic light-emitting display panel may include an organic light-emitting material. A light-emitting layer of the quantum dot light-emitting display panel may include a quantum dot, a quantum rod, etc. Hereinafter, the display panel DP will be described as an organic light-emitting display panel.

The display panel DP may include a base layer BL, a circuit layer ML, a light-emitting element layer EL, and a thin film-sealing layer TFE.

The base layer BL may include a flexible material, and, for example, the base layer BL may be a plastic substrate. The plastic substrate may include at least one of an acryl-based resin, a methacryl-based resin, a polyisoprene resin, a vinyl-based resin, an epoxy-based resin, a urethane-based resin, a cellulose-based resin, a siloxane-based resin, a polyimide-based resin, a polyamide-based resin, and/or a perylene-based resin. For example, the base layer BL may include a single layered polyimide resin. However, an embodiment of the present inventive concept is not limited thereto, and, for example, the base layer BL may be a stacked structure including a plurality of insulating layers.

The circuit layer ML may be disposed on the base layer BL. The circuit layer ML may include a plurality of insulating layers, a plurality of conductive layers, vias, and a semiconductor layer.

The light-emitting element layer EL may be disposed on the circuit layer ML. The light-emitting element layer EL may include a display element, for example, an organic light-emitting diode.

The thin film-sealing layer TFE seals the light-emitting element layer EL. The thin film-sealing layer TFE may include a plurality inorganic layers, and at least one organic layer disposed therebetween.

The input sensing layer ISL may be disposed on the thin film-sealing layer TFE. For example, the input sensing layer ISL may be disposed directly on the thin film-sealing layer TFE. For example, the input sensing layer ISL may be formed on the thin film-sealing layer TFE through a continuous process. However, an embodiment of the present inventive concept is not limited thereto, and the input sensing layer ISL may be bonded to the display panel DP via an adhesive, after the input sensing layer ISL is formed through a separate operation.

Figure 6A:
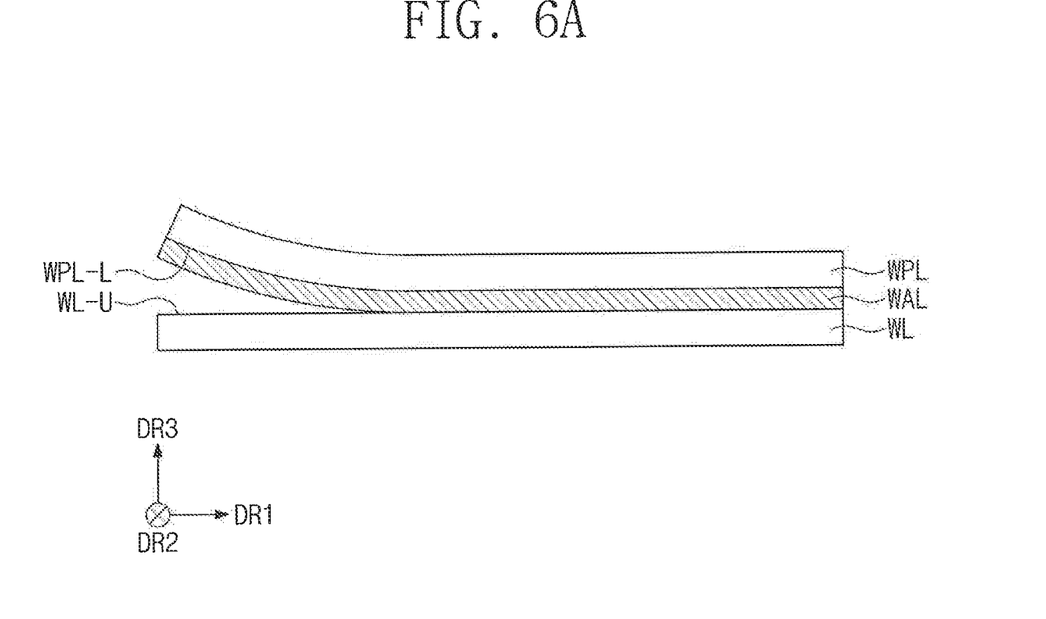
FIGS. 6A, 6B and 6C are cross-sectional views schematically illustrating a rework operation of a window structure according to an embodiment of the inventive concept.
Figure 6B:
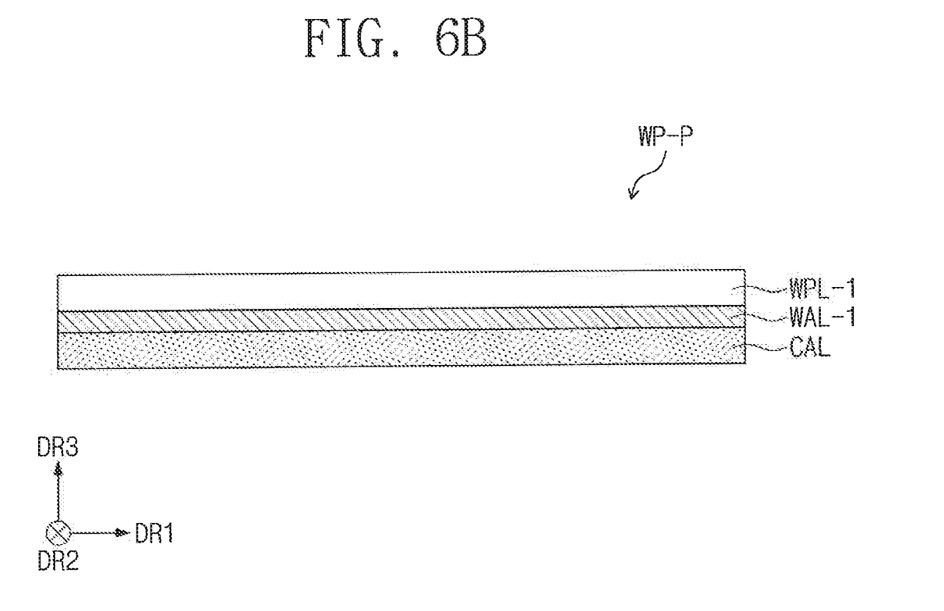
Figure 6C:
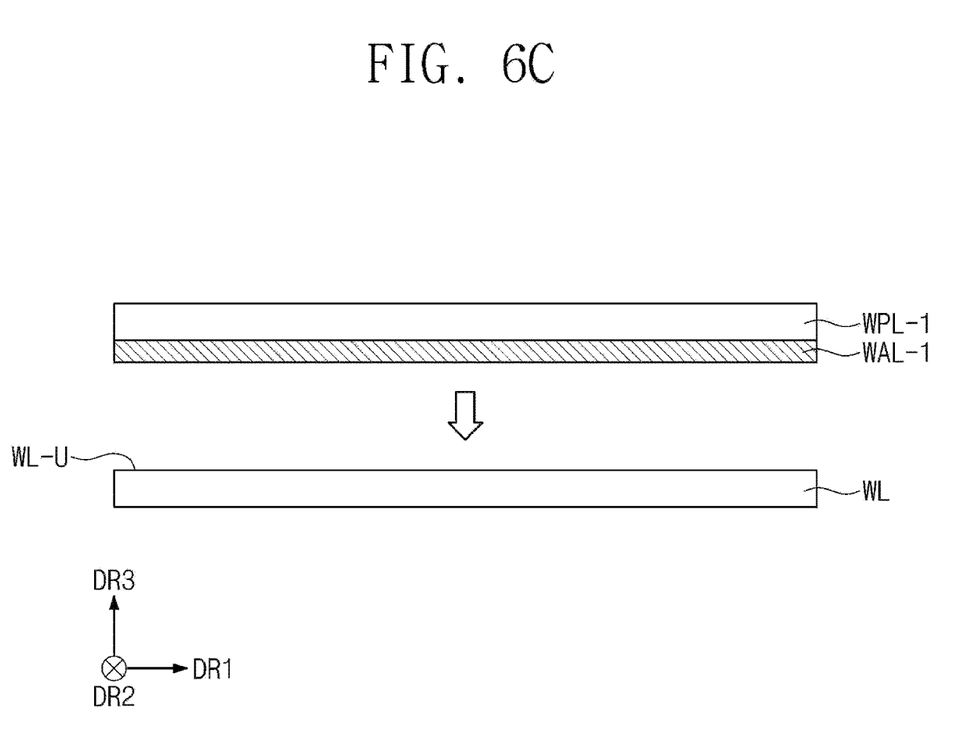

FIGS. 6A to 6C are cross-sectional views schematically illustrating a rework operation of a window structure according to an embodiment of the present inventive concept. FIGS. 6A to 6C schematically illustrate, in sequence, operations for reworking the window protective layer WPL in the window structure WP according to an embodiment of the present inventive concept illustrated in FIG. 4A. Operations for reworking the window protective layer WPL of the window structure WP' according to an embodiment of the present inventive concept illustrated in FIG. 4B may be performed in the same order.

Referring to FIGS. 4A, 6A, and 6B, in the window structure WP according to an embodiment of the present inventive concept, a rework operation for attaching a new window protective layer WPL-1 after removing the window protective layer WPL may be performed. In an embodiment of the present inventive concept, the new window protective layer WPL-1 may be attached through a new window adhesive layer WAL-1 to the window WL, after both the window protective layer WPL and the window adhesive layer WAL are removed together from the window structure WP.

In an operation for removing the window protective layer WPL and the window adhesive layer WAL from the window structure WP, the residue of the window adhesive layer WAL may not occur on the upper surface WL-U of the window WL. As the window adhesive layer WAL according to an embodiment of the present inventive concept includes a surfactant such as polyoxyethylene alkyl ether, an adhesive force to the upper surface WL-U of the window WL may be controlled in the range of about 100 gf/inch to about 300 gf/inch at room temperature (e.g., about 25° C.). Accordingly, the residue of the window adhesive layer WAL may not occur on the upper surface WL-U of the window WL during an operation for removing the window protective layer WPL and the window adhesive layer WAL. Therefore, since rework may be performed on only the window protective layer WPL and not on the total window structure WP, the process may be simplified and material costs may be reduced, thereby increasing productivity.

Referring to FIG. 6B, the new window protective layer WPL-1 according to an embodiment of the present inventive concept may be provided while being attached to a carrier substrate CAL through the new window adhesive layer WAL-1. For example, the new window protective layer WPL-1 may be provided as a rework structure WP-P, in which the new window protective layer WPL-1 may be attached to the carrier substrate CAL through the new window adhesive layer WAL-1. For example, the carrier substrate CAL may be a polyimide (PI) film, a polyethylene terephthalate (PET) film, a polyamide film, a polyacrylate film, a polymethylmethacrylate (PMMA) film, a polycarbonate (PC) film, or a polyethylenenaphthalate (PEN) film.

Referring to FIGS. 6A to 6C, the new window protective layer WPL-1 is attached, through the new window adhesive layer WAL-1, to the upper surface of the window WL, from which the existing window protective layer WPL and window adhesive layer WAL have been removed. The new window protective layer WPL-1 and the new window adhesive layer WAL-1 may be provided on the window WL, after the carrier substrate CAL is removed from the rework structure WP-P. When the new window protective layer WPL-1 and the new window adhesive layer WAL-1 are provided, the residue of the existing window adhesive layer WAL is not present on the window WL, so that rework may be easily performed on the new window protective layer WPL-1 and the new window adhesive layer WAL-1.

Hereinafter, the present inventive concept will be described in more detail through a specific Example and a Comparative Example. The following Example is only an example to help understanding of the present inventive concept, and the scope of the present inventive concept is not limited thereto.

(Comparison of Adhesive Force at Each Temperature Condition)

The following Table 1 shows evaluation data for an adhesive force in a window structure according to Example and Comparative Example. In the "Example" of Table 1, the adhesive force of the interface between a window and a window adhesive layer were measured in a window structure in which the window adhesive layer disposed between the window and the window protective layer includes polyoxyethylene alkyl ether. In the "Comparative Example" of Table 1, the adhesive force of the interface between a window and a window adhesive layer were measured in a window structure in which the window adhesive layer disposed between the window and the window protective layer does not include polyoxyethylene alkyl ether.

TABLE 1

| Measurement condition | Measurement temperature | Example | Comparative Example |
|---|---|---|---|
| Immediately after adhering | Room temperature (25° C.) | 100~200 gf/inch | 500~600 gf/inch |
| 24 hours after adhering | Room temperature (25° C.) | 200~300 gf/inch | 600~700 gf/inch |
| | Heated at 60° C. for 10 minutes | 10~60 gf/inch | 100~200 gf/inch |
| | Heated at 80° C. for 10 minutes | 10~50 gf/inch | 50~100 gf/inch |

Referring to Table 1, since the window adhesive layer disposed between the window and the window protective layer in the window structure according to the Example of the present inventive concept includes a surfactant such as polyoxyethylene alkyl ether, the adhesive force measured immediately after adhering to the window and the window protective layer at room temperature (e.g., about 25° C.) is in the range of about 100 gf/inch to about 200 gf/inch, and the adhesive force measured about 24 hours after adhering at room temperature (e.g., about 25° C.) satisfies the range of about 200 gf/inch to about 300 gf/inch. In addition, after 24 hours from adhering, the adhesive force of the window structure, measured under the condition of heating at a high temperature range of about 60° C. for ten minutes, satisfies the range of about 10 gf/inch to about 60 gf/inch, and the adhesive force of the window structure measured under the condition of heating at a high temperature of about 80° C. for ten minutes satisfies the range of about 10 gf/inch to about 50 gf/inch. In the Comparative Example in which the window adhesive layer does not include polyoxyethylene alkyl ether, the adhesive force between the window and the window adhesive layer measured under each of a room temperature condition and a high-temperature condition is about three times greater than that in the Example. This causes the residue of the window adhesive layer to be present on the surface of the window during removal of the window adhesive layer and the window protective layer from the window for a rework operation, thereby making it impossible to perform a separate rework on only the window protective layer. Since the window adhesive layer, which is disposed between the window and the window protective layer, includes polyoxyethylene alkyl ether in the window structure according to the Example, the adhesive force may be controlled to an appropriate range, so that a separate rework may be performed on the window protective layer.

(Evaluation of Folding Reliability)

The following Table 2 shows evaluation data for folding reliability in a window structure according to the Example of the present inventive concept. In the "Example" of Table 2, a window structure, in which the window adhesive layer disposed between the window and the window protective layer includes polyoxyethylene alkyl ether, was folded a plurality of times to determine whether a defect such as buckling on the interface between the window and the window adhesive layer occurs or not is checked. If no defect occurs, the window structure is marked as 'good'.

TABLE 2

| Type | Measured temperature and condition | Criteria | Test result |
|---|---|---|---|
| Folding a plurality of times | Room temperature (25° C.) | 200,000 times | Good |
| | 60° C. | 150,000 times | Good |
| | 60° C./ Humidity 93% | 150,000 times | Good |

TABLE 2-continued

| Type | Measured temperature and condition | Criteria | Test result |
|---|---|---|---|
| | −20° C. | 50,000 times | Good |
| | −10° C. ↔ 65° C.// Humidity 93% | 60,000 times | Good |
| Maintaining after folding | Room temperature (25° C.) | 240 hours | Good |
| | 60° C./ Humidity 93% | 240 hours | Good |
| | 85° C. | 240 hours | Good |
| | −40° C. | 240 hours | Good |
| | −10° C. ↔ 65° C.// Humidity 93% | Converting 100 times | Good |

Referring to Table 2, it is confirmed that, even if the window structure according to the Example of the present inventive concept is folded a plurality of times under a reliability condition including a room temperature condition, a high temperature condition, and a high-temperature and high-humidity condition, a defect such as buckling does not occur. It is also confirmed that, when the window structure according to the Example of the present inventive concept is folded and then maintained under various conditions, a defect such as buckling on the interface between the window and the window adhesive layer does not occur. Since the adhesive force of the window adhesive layer disposed between the window and the window protective layer in the window structure according to the Example is controlled to an appropriate range, a separate rework may be performed on the window protective layer and a buckling defect of the adhesive layer due to folding may be prevented. Therefore, when the window structure is applied to a display device, the folding reliability of the display device may be increased.

According to an embodiment of the inventive concept, since a separate rework may be performed on the window protective layer attached to a window, a defect such as buckling between the window and an adhesive layer resulting from folding may be prevented from occurring while increasing the productivity of the window for a display device, so that the folding reliability of the display device may be increased.

While the present inventive concept has been described with reference to embodiments thereof, it will be understood by those of ordinary skill in the art that various changes in form and details may be made thereto without departing from the spirit and scope of the present inventive concept.

What is claimed is:

1. A display device comprising:
a display module;
a window disposed on the display module;
a window protective layer disposed on the window; and
a window adhesive layer disposed between the window and the window protective layer,
wherein the window adhesive layer includes a surfactant, and has an adhesive force of about 100 gf/inch to about 300 gf/inch at about 25° C.

2. The display device of claim 1, wherein the surfactant comprises polyoxyethylene alkyl ether.

3. The display device of claim 1, wherein the window adhesive layer further comprises a polymer resin including at least one of an acryl-based resin, a silicone-based resin, a urethane-based resin, or an epoxy-based resin.

4. The display device of claim 1, wherein the window adhesive layer comprises: a surfactant layer including the surfactant and contacting the window; and
a main adhesive layer, wherein the surfactant layer is disposed between the window and the adhesive main layer.

5. The display device of claim 1, wherein a thickness of the window adhesive layer is about 10 µm to about 30 µm.

6. The display device of claim 1, wherein a thickness of the window protective layer is about 40 µm to about 150 µm.

7. The display device of claim 1, wherein the window adhesive layer has an adhesive force of about 10 gf/inch to about 60 gf/inch at a temperature greater than or equal to about 60° C.

8. The display device of claim 1, wherein the surfactant is included in the window adhesive layer in an amount of about 0.1 wt % to about 3 wt % with respect to a total weight of the window adhesive layer.

9. The display device of claim 1, further comprising an antireflection layer disposed between the window and the display module.

10. The display device of claim 1, wherein an upper surface of the window protective layer provides an uppermost surface of the display device.

11. The display device of claim 1, wherein a first non-folding region, a folding region, and a second non-folding region are sequentially arranged along a first direction in the display module.

12. The display device of claim 1, further comprising:
a protective layer disposed under the display module; and
a plate disposed under the protective layer.

13. The display device of claim 1, wherein the window adhesive layer contacts a lower surface of the window protective layer and an upper surface of the window.

14. The display device of claim 1, wherein the display module comprises:
a base layer;
a circuit layer disposed on the base layer;
a light-emitting element layer disposed on the circuit layer;
a sealing layer disposed on the light-emitting element layer; and
a sensor layer disposed on the sealing layer.

15. A display device comprising:
a display module;
a window disposed on the display module;
a window protective layer disposed on the window; and
a window adhesive layer disposed between the window and the window protective layer,
wherein the window adhesive layer includes:
a polymer resin including at least one of an acryl-based resin, a silicone-based resin, a urethane-based resin, or an epoxy-based resin, and
a surfactant including polyoxyethylene alkyl ether.

16. The display device of claim 15, wherein the window adhesive layer has an adhesive force of about 10 gf/inch to about 60 gf/inch at a temperature greater than or equal to about 60° C.

17. The display device of claim 15, wherein an upper surface of the window protective layer is exposed to outside.

18. A display device comprising:
a display module configured to fold and unfold;
a window disposed on the display module;
a window protective layer disposed on the window; and a window adhesive layer disposed between the window and the window protective layer, and contacting an upper surface of the window and a lower surface of the window protective layer, wherein the window adhesive layer includes a surfactant.

19. The display device of claim 18, wherein the surfactant includes polyoxyethylene alkyl ether.

20. The display device of claim 18, wherein the window adhesive layer further comprises a polymer resin including at least one of an acryl-based resin, a silicone-based resin, a urethane-based resin, or an epoxy-based resin.

\* \* \* \* \*